US012676634B2

(12) United States Patent

Healy et al.

(10) Patent No.: US 12,676,634 B2
(45) Date of Patent: Jul. 7, 2026

(54) INTERPOLATION BETWEEN LOG AND ONE-HOT ENCODINGS

(71) Applicant: Dell Products L.P., Round Rock, TX (US)

(72) Inventors: Brendan Burns Healy, Haddonfield, NJ (US); Miguel Paredes Quiñones, Campinas (BR)

(73) Assignee: Dell Products L.P., Round Rock, TX (US)

( * ) Notice: Subject to any disclaimer, the term of this patent is extended or adjusted under 35 U.S.C. 154(b) by 250 days.

(21) Appl. No.: 18/544,916

(22) Filed: Dec. 19, 2023

(65) Prior Publication Data

US 2025/0202499 A1 Jun. 19, 2025

(51) Int. Cl.
*H03M 7/00* (2006.01)
*G06N 10/60* (2022.01)
*H03M 7/30* (2006.01)

(52) U.S. Cl.
CPC .............. *H03M 7/60* (2013.01); *G06N 10/60* (2022.01)

(58) Field of Classification Search
CPC ................................. H03M 7/60; G06N 10/60

USPC ...................................................... 341/50, 51
See application file for complete search history.

(56) References Cited

U.S. PATENT DOCUMENTS

| | | | |
|---|---|---|---|
| 2020/0409918 A1* | 12/2020 | Mandal .................... | G06N 5/01 |
| 2021/0365826 A1* | 11/2021 | Rolfe ..................... | G06F 18/214 |
| 2024/0013048 A1* | 1/2024 | Deshpande ........... | G06N 3/045 |
| 2024/0354369 A1* | 10/2024 | Bowles .................. | G06F 17/11 |

FOREIGN PATENT DOCUMENTS

JP 2007295617 A * 11/2007

OTHER PUBLICATIONS https://pyqubo.readthedocs.io/en/latest/reference/integer.html#pyqubo, (accessed Apr. 3, 2025).

* cited by examiner

*Primary Examiner* — Jean B Jeanglaude
(74) *Attorney, Agent, or Firm* — Workman Nydegger

(57) ABSTRACT

Encoding problems to be executed on quantum computing systems. A scaled log encoding is performed by dividing a variable of the problem into pieces. Each piece is log encoded and then submitted for execution. This reduces the coefficient size of the encodings compared to strict log encoding while increasing the number of variables.

19 Claims, 4 Drawing Sheets

400

Storage Media
408

UI Device
410

Data Storage
412

Memory
402

NVRAM
404

Processor
406

Application(s)
414

INTERPOLATION BETWEEN LOG AND ONE-HOT ENCODINGS

FIELD OF THE INVENTION

Embodiments of the present invention generally relate to quantum computing systems and quantum computing related operations. More particularly, at least some embodiments of the invention relate to systems, hardware, software, computer-readable media, and methods for encoding problems for execution in quantum computing systems.

BACKGROUND

A combinatorial problem often involves a scenario where there is a desire to identify a good solution from among a very large number of possible solutions. The traveling salesman problem is an example of a combinatorial optimization problem. Quantum computing systems, such as quantum annealers, are often used to identify a suitable solution to a combinatorial problem.

The combinatorial problem (or other type) may be represented in a format such as quadratic unconstrained binary optimization (QUBO) model. In one example, a QUBO is a single multivariable quadratic polynomial whose solution is obtained by minimizing the function in a quantum annealer.

When preparing to the solve a problem in a quantum annealer, the problem may need to be transformed into the QUBO form. Transforming the problem may include converting integers or other kinds of variable to binary form. This is typically achieved by performing log encoding, unary encoding, or one-hot encoding.

Encoding optimization problems using these types of encodings has several disadvantages. Log encoding, for example, may use fewer binary variables compared to unary or one-hot encoding techniques. However, log encoding results in coefficients that grow exponentially with the size of variables. Large coefficients in the Hamiltonian of the QUBO can impact the accuracy of the results. Unary encoding is often simpler to perform compared to log encoding. The disadvantage is the unary encoding may require a substantially larger number of binaries.

For example, encoding an integer in the range [0,1000] requires a coefficient as large as 489 in log encoding while using 1000 binaries in unary encoding. Both of the encoding techniques may present challenges for quantum annealers. For example, limited binary capacity is a problem for unary encoding and a noise level of the device is a problem for log encoding.

BRIEF DESCRIPTION OF THE DRAWINGS

In order to describe the manner in which at least some of the advantages and features of the invention may be obtained, a more particular description of embodiments of the invention will be rendered by reference to specific embodiments thereof which are illustrated in the appended drawings. Understanding that these drawings depict only typical embodiments of the invention and are not therefore to be considered to be limiting of its scope, embodiments of the invention will be described and explained with additional specificity and detail through the use of the accompanying drawings, in which.

DETAILED DESCRIPTION OF SOME EXAMPLE EMBODIMENTS

Embodiments of the present invention generally relate to quantum computing systems and related operations. More particularly, at least some embodiments of the invention relate to systems, hardware, software, computer-readable media, and methods for encoding problems into a format or model such as a quadratic unconstrained binary optimization (QUBO) model, which is an example of a quadratic binary model (QBM).

Embodiments of the invention are discussed in the context of QUBO models, but are not limited thereto. Embodiments of the invention may be applied to other models including, by way of example, Ising models and HOBO models. Embodiments of the invention are further discussed in the context of quantum annealers including physical and simulated quantum annealers. Simulated quantum annealers are executed in classical computing systems that include processors, memory, and other hardware.

In the context of quantum annealers, QBMs are a general class of problems used by quantum annealers to sample solutions for a given problem. An objective function is often used to represent how a particular combination of variables satisfies or solves a problem such as a combinatorial problem.

Figure 1:
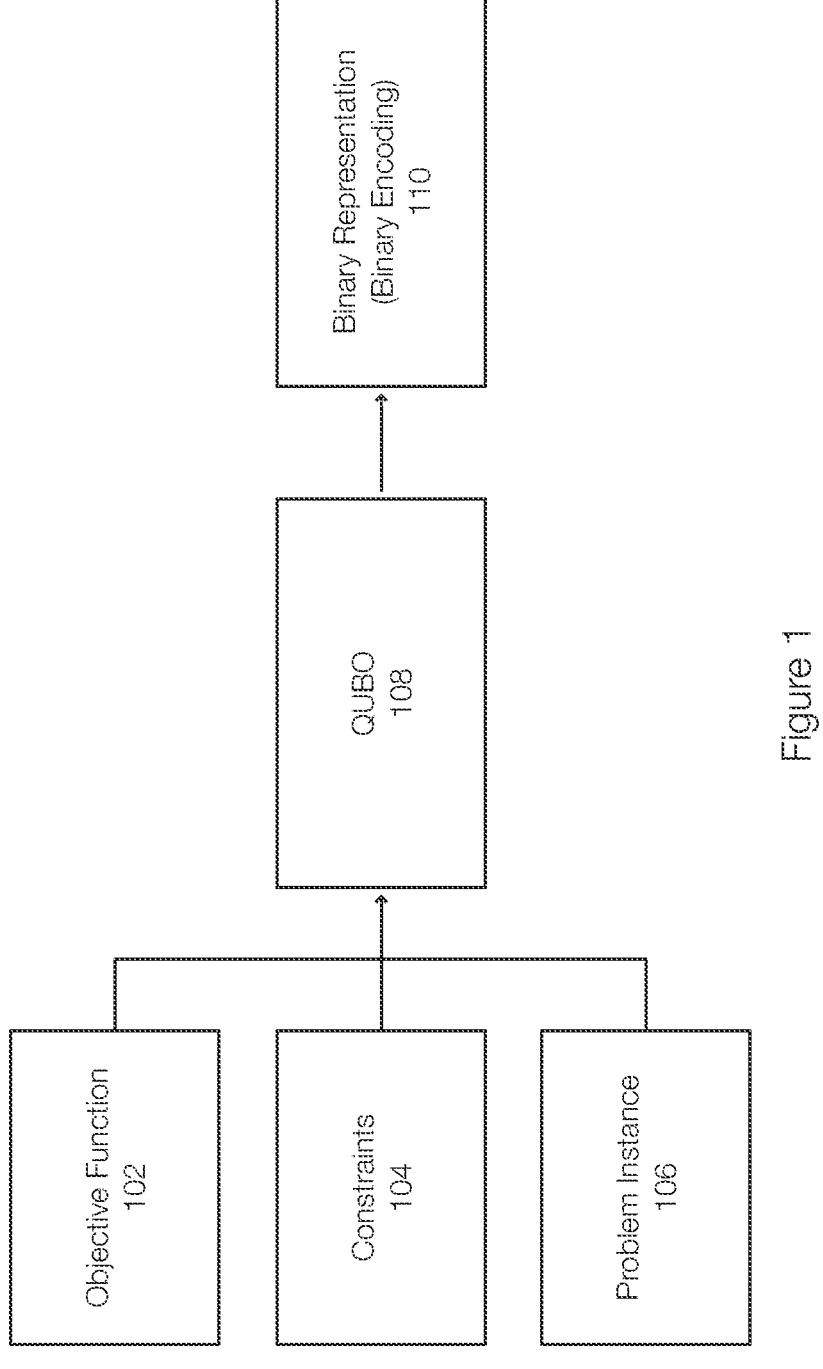
FIG. 1 discloses aspects of encoding a problem represented as a quadradic unconstrainted binary optimization model.

FIG. 1 discloses aspects of a QUBO. FIG. 1 illustrates an example where an objective function 102, constraints 104, and a problem instance 106 are transformed into a QUBO 108. The objective function 102 mathematically expresses a problem using binary values. For example, an objective function may be represented as:

$$Q(x) = \sum_{i=1}^{N} q_i x_i + \sum_{j=i+1}^{N} q_{ij} x_i x_j.$$

As illustrated, the objective function 102 may include a linear term and a quadratic term. When solving a QUBO, the goal is to identify the variable assignments that minimize the objective function 106. A QUBO may have a large number of variables and the process of determining or identifying a solution may attempt to select a best known or optimal solution from all of the possible combinations.

Although a QUBO may be unconstrained, the constraints 104 are often introduced. The constraints 106 may ensure that some solutions are avoided. For example, the constraints 104 may be configured to penalize solutions that violate the constraints. The problem instance 106 may be a specific representation of a general problem definition in one example.

Thus, in one example, the objective function 102, the constraints 104, and the problem instance 106 are transformed into the QUBO 108. The QUBO 108 may have a binary representation 110. The binary representation includes the binary variables.

For example, a problem or QUBO may include or be associated with an integer or continuous variable x. The variable x will be encoded using log encoding with 3 bits (N=3). Thus, $x = w_0 + 2w_1 + 4w_2$ or, in another form, $$x = \sum_{i=0}^{N-1} 2^i w_i.$$

If x=7, then the binary encoding determines the binary value (0 or 1) for each $w_i$. Thus, $7=1+2(1)+4(1)$ or $w_0=w_1=w_2=1$. For example, if an objective function is Energy=$(x-0.5)^2$, the objective function can be log encoded (assuming N=3) to be $$\text{Energy} = \left( \sum_{i=0}^{2} 2^i w_i - 0.5 \right)^2.$$

One problem with log encoding is that as larger integers may result in a binary encoding with unbalanced coefficients.

In unary (one-hot encoding is similar) encoding, the integer is replaced with a series of ones equal to the value of the integer. For instance, 3 is encoded as 111. As previously stated, the difficulty with unary encoding occurs with large integers of complex optimization problems. For example, a value of 1000 would require a series of 1000 1s.

Embodiments of the invention relate to a sliding scale encoding method. Embodiments of the invention, in effect, interpolate between log encodings and unary encodings to provide a balance between coefficient size and binary variable count. Further, this balance can be adjusted (e.g., a sliding scale) in real time on a per variable basis, depending on the capacity of the quantum annealer and an accuracy assessment. Embodiments of the invention can be adjusted to account for the variable range of the problem, hardware specifications of the quantum annealer, or the like.

Embodiments of the invention divide an encoding operation into multiple encoding operations. This has the effect of reducing the coefficient size because the maximum range of logical variables is reduced. A scaled encoding operation may use more bits that log encoding.

For example, a problem may have a range of X in [0,1000]. If log encoding is employed in this example, X would require 10 binary variables with a maximum coefficient of 512. Unary encoding X would require 1000 binary variables.

Embodiments of the invention interpolate or perform a scaled encoding between these two approaches in a manner that reduces the size of the maximum coefficient at the expense of increasing the number of binary variables compared to log encoding.

In one example, the variable X is decomposed into a set of variables U, W, Y, and Z. Each of these variables is in a range of [0,250]. Thus, X=U+W+Y+Z.

These decomposed variables may be log encoded as follows:

$$U = 1u_0 + 2u_1 + 4u_2 + 8u_3 + 16u_4 + 32u_5 + 64u_6 + 128u_7,$$

$$W = 1w_0 + 2w_1 + 4w_2 + 8w_3 + 16w_4 + 32w_5 + 64w_6 + 128w_7,$$

$$Y = 1y_0 + 2y_1 + 4y_2 + 8y_3 + 16y_4 + 32y_5 + 64y_6 + 128y_7,$$

$$Z = 1z_0 + 2z_1 + 4z_2 + 8z_3 + 16z_4 + 32z_5 + 64z_6 + 128z_7.$$

This example illustrates the variable X in [0,1000] can be represented in scaled encoding using 32 binary variables (8*4) with a maximum coefficient of 128. This in an increase in the number of binary variable (e.g., 10 binary variables)

required to log encode X in [0,1000] and reduces the size of the largest coefficient Scaled encoding also achieves a large reduction compared to the number of binary variables (1000 binary variables) required to unary encode X in [0,1000]. Embodiments of the invention thus divide or separate the variable into pieces that may sum to the original value.

In this example, embodiments of the invention perform a sliding or scaled log encoding that effectively interpolates between the binary variables required for strict log encoding and unary encoding. In the example of scaled log encoding above, roughly 3% of the binary variables required for unary encoding are needed and about three times the number of binary variables required for log encoding may be used. This tradeoff may vary according to various selections.

Figure 2:
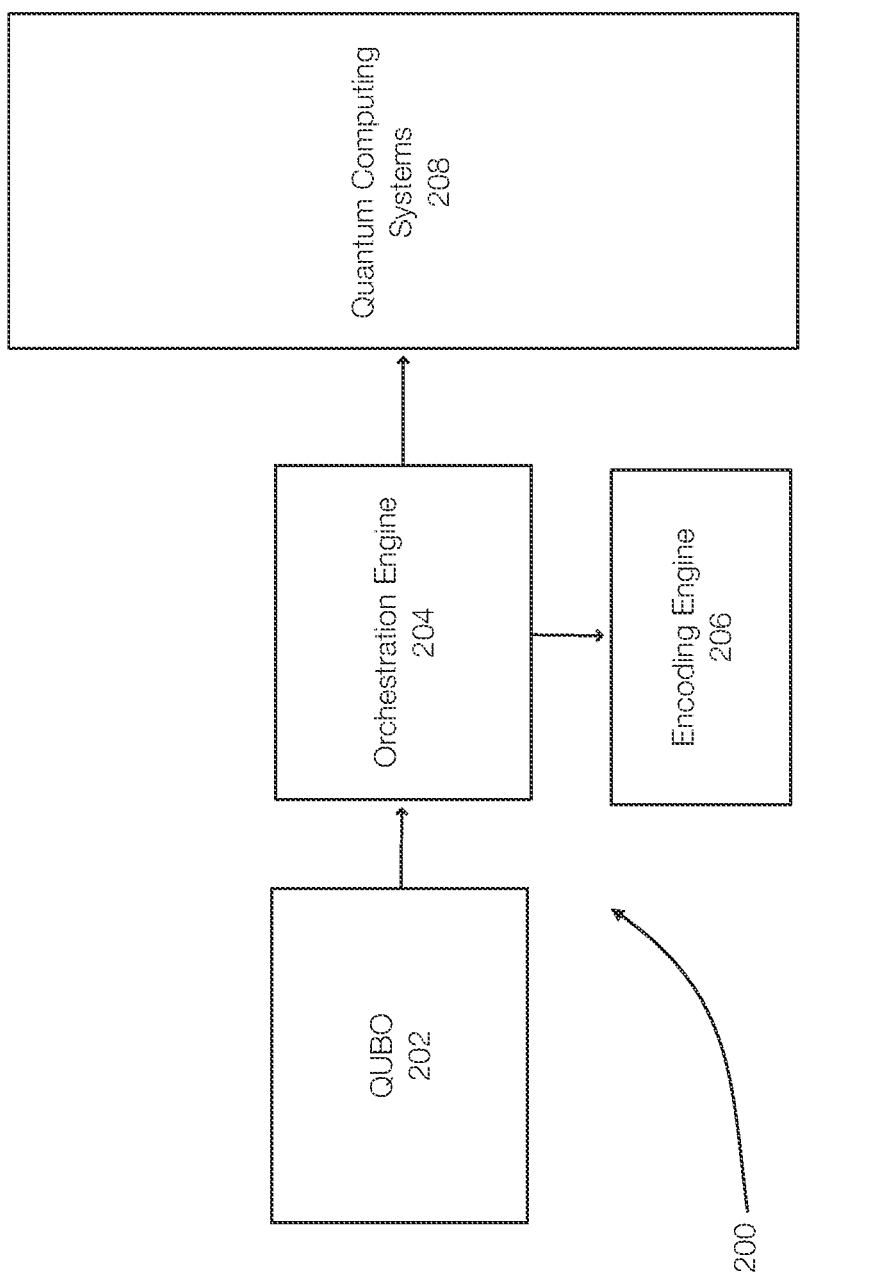
FIG. 2 discloses aspects of an orchestration system configured to orchestrate the execution of quantum jobs.

FIG. 2 discloses aspects of an orchestration system configured to orchestrate the execution of quantum jobs. FIG. 2 illustrates an orchestration system that includes an orchestration engine 204. The orchestration engine 204 may be a cloud-based service that includes servers or other computing devices with processors, memory, and networking hardware. The orchestration engine 204 receives a QUBO 202 from a client. The orchestration engine 204 more generally receives a quantum job and may perform some processing to generate the QUBO 202. The orchestration engine 204 may perform various operations or tasks related to the execution of the QUBO 202. Example operations may include converting the QUBO 202 into a graph, performing minor graph embedding, mapping the QUBO to the qubits of a quantum computing system, which may be selected from quantum computing systems 208 available to the orchestration engine 204, or the like. The quantum computing systems 208 may include quantum computing systems, quantum annealers, both real and simulated. The orchestration engine 204 may submit the QUBO 202 to a selected quantum computing system and return results to the client.

As illustrated in FIG. 2, the orchestration system 200 (or the orchestration engine 204) may include or have access to an encoding engine 206. The encoding engine 206 is configured to perform various types of encoding including log encoding, unary encoding, and sliding or scaled log encoding.

Figure 3:
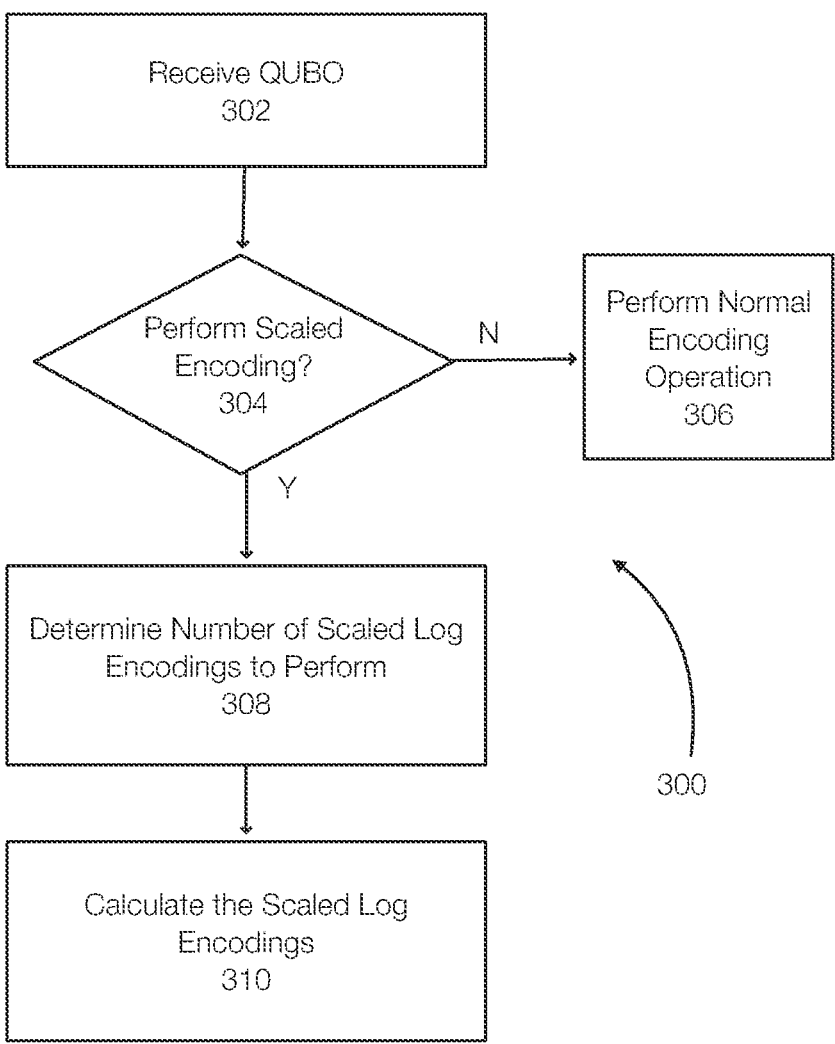
FIG. 3 discloses aspects of scaled log encoding.

FIG. 3 discloses aspects of scaled log encoding. In the method 300, a QUBO (or other problem type in another formal or model) is received 302. Next, the method 300 determines whether scaled log encoding should be performed. If scaled log encoding is not performed (N at 304), then regular encoding is performed (e.g., log encoding, unary encoding).

Determining whether scaled log encoding is performed may depend, in one example, on the expected coefficients. For instance, a cutoff value for the coefficient size may be selected (or predetermined). This can vary on a customer basis or for other reasons. If conventional log encoding results in a coefficient that is larger than the cutoff value, then scaled log encoding is performed. More specifically, if log encoding for a particular parameter results in a single coefficient on the objective function that is larger than some integer M (the cutoff value), then scaled log encoding is performed (Y at 304).

In addition to scaled log encoding using multiple log encodings, embodiments of the invention further relate to determining whether how to perform the scaled log encoding or how to divide the original QUBO variable into a sum of smaller variables.

If scaled log encoding is performed (Y at 304), then the number of scaled log encodings to perform is determined 308. In one example, the number of scaled log encodings is the number that ensures that all coefficients are less than M or less than the cutoff value. For instance, the k log encoded pieces is ensured by the following relationship:

$$\log\left(\frac{N}{k}\right) \le M \rightarrow k = \lceil Ne^{-M} \rceil.$$

In this example, k is the number of encodings and N is the range of the original variable or the difference between the maximum and minimum. Thus, if the range of the variable is [0,1000], then N is 1000. If the range is [150,400], then N is 250. After determining k, the scaled log encodings (k in number) are calculated 300. In one example this results in (k−1) encodings of [N/k] and one encoding of (N−(k−1)·N/k). This is illustrated by way of example as other manners to optimize the number of qubits may be performed.

The cutoff value M can be based on a function of various data. In one example, the cutoff value is based on the size of the weights on the constraints, and the coefficient of the constraints, as these values may determine, together with the cutoff value, the overall values present in the QUBO. Similarly, the coefficients of the objective function may be considered as previously described. The approximate size and density of the QUBO may also be used to determine the cutoff value. The size of the QUBO relates to the total number of variables and the density relates to the number of non-zero entries in the matrix. However, these considerations are approximated because exact values are not available until after the QUBO is compiled. More generally, splitting a QUBO based on a cutoff value can depend on the features and metadata of the original problem or can be determined using other metadata.

Embodiments of the invention, such as the examples disclosed herein, may be beneficial in a variety of respects. For example, and as will be apparent from the present disclosure, one or more embodiments of the invention may provide one or more advantageous and unexpected effects, in any combination, some examples of which are set forth below. It should be noted that such effects are neither intended, nor should be construed, to limit the scope of the claimed invention in any way. It should further be noted that nothing herein should be construed as constituting an essential or indispensable element of any invention or embodiment. Rather, various aspects of the disclosed embodiments may be combined in a variety of ways so as to define yet further embodiments. For example, any element(s) of any embodiment may be combined with any element(s) of any other embodiment, to define still further embodiments. Such further embodiments are considered as being within the scope of this disclosure. As well, none of the embodiments embraced within the scope of this disclosure should be construed as resolving, or being limited to the resolution of, any particular problem(s). Nor should any such embodiments be construed to implement, or be limited to implementation of, any particular technical effect(s) or solution(s). Finally, it is not required that any embodiment implement any of the advantageous and unexpected effects disclosed herein.

It is noted that embodiments of the invention, whether claimed or not, cannot be performed, practically or otherwise, in the mind of a human. Accordingly, nothing herein should be construed as teaching or suggesting that any aspect of any embodiment of the invention could or would be performed, practically or otherwise, in the mind of a human. Further, and unless explicitly indicated otherwise herein, the disclosed methods, processes, and operations, are contemplated as being implemented by computing systems that may comprise hardware and/or software. That is, such methods processes, and operations, are defined as being computer-implemented.

In general, embodiments of the invention may be implemented in connection with systems, software, and components, that individually and/or collectively implement, and/or cause the implementation of, operations which may include, but are not limited to, quantum computing operations, encoding operations, log encoding operations, interpolated or scaled encoding operations, quantum annealing operations, QUBO related operations including per-execution operations, execution operations, and post-execution operations, or the like. More generally, the scope of the invention embraces any operating environment in which the disclosed concepts may be useful.

New and/or modified data collected and/or generated in connection with some embodiments, may be stored in a data storage environment that may take the form of a public or private cloud storage environment, an on-premises storage environment, and hybrid storage environments that include public and private elements. Any of these example storage environments, may be partly, or completely, virtualized. The storage environment may comprise, or consist of, a datacenter which is operable to perform operations initiated by one or more clients or other elements of the operating environment.

Example cloud computing environments, which may or may not be public, include storage environments that may provide data protection functionality for one or more clients. Another example of a cloud computing environment is one in which processing, data protection, and other, services may be performed on behalf of one or more clients. Some example cloud computing environments in connection with which embodiments of the invention may be employed include, but are not limited to, Microsoft Azure, Amazon AWS, Dell EMC Cloud Storage Services, and Google Cloud. More generally however, the scope of the invention is not limited to employment of any particular type or implementation of cloud computing environment.

In one example, the orchestration system may be implemented as a cloud-based service. Services may include encoding services, and other quantum job orchestration related operations.

In addition to the cloud environment, the operating environment may also include one or more clients or machines that are capable of collecting, modifying, and creating, data. As such, a particular client may employ, or otherwise be associated with, one or more instances of each of one or more applications that perform such operations with respect to data. Such clients may comprise physical machines, containers, or virtual machines (VMs).

Particularly, devices in the operating environment may take the form of software, physical machines, containers or VMs, or any combination of these, though no particular device implementation or configuration is required for any embodiment. Similarly, data storage system components such as databases, storage servers, storage volumes (LUNs), storage disks, or the like, for example, may likewise take the form of software, physical machines. Containers, or virtual machines (VMs), though no particular component implementation is required for any embodiment.

Example embodiments of the invention are applicable to any system capable of storing and handling various types of objects, in analog, digital, or other form.

It is noted that any operation(s) of any of the methods discloses herein, may be performed in response to, as a result of, and/or, based upon, the performance of any preceding operation(s). Correspondingly, performance of one or more operations, for example, may be a predicate or trigger to subsequent performance of one or more additional operations. Thus, for example, the various operations that may make up a method may be linked together or otherwise associated with each other by way of relations such as the examples just noted. Finally, and while it is not required, the individual operations that make up the various example methods disclosed herein are, in some embodiments, performed in the specific sequence recited in those examples. In other embodiments, the individual operations that make up a disclosed method may be performed in a sequence other than the specific sequence recited.

Following are some further example embodiments of the invention. These are presented only by way of example and are not intended to limit the scope of the invention in any way.

Embodiment 1. A method comprising: receiving a problem from a client at an orchestration engine, dividing a variable into a number of pieces, performing scaled encoding on each of the pieces, and combining the encoded pieces into a final encoding.

Embodiment 2. The method of embodiment 1, wherein the problem comprises a quadratic unconstrained binary optimization model.

Embodiment 3. The method of embodiment 1 and/or 2, wherein the variable comprises an integer variable having a range.

Embodiment 4. The method of embodiment 1, 2, and/or 3, wherein scaled encoding comprises performing log encoding on each of the pieces.

Embodiment 5. The method of embodiment 1, 2, 3, and/or 4, further comprising determining whether to perform the scaled encoding based on a cutoff value.

Embodiment 6. The method of embodiment 1, 2, 3, 4, and/or 5, wherein the scaled log encoding ensures that coefficients in the scaled log encodings are less than the cutoff value.

Embodiment 7. The method of embodiment 1, 2, 3, 4, 5, and/or 6, wherein the number of pieces is based on a range of the variable.

Embodiment 8. The method of embodiment 1, 2, 3, 4, 5, 6, and/or 7, wherein the cutoff value is based on weights of constraints and/or coefficients of the constraints.

Embodiment 9. The method of embodiment 1, 2, 3, 4, 5, 6, 7, and/or 8, wherein the problem comprises an Ising model or a HOBO model.

Embodiment 10. The method of embodiment 1, 2, 3, 4, 5, 6, 7, 8, and/or 9, wherein the scaled encodings comprise an interpolation between log encoding and unary encoding.

Embodiment 11 A system, comprising hardware and/or software, operable to perform any of the operations, methods, or processes, or any portion of any of these, disclosed herein.

Embodiment 12 A non-transitory storage medium having stored therein instructions that are executable by one or more hardware processors to perform operations comprising the operations of any one or more of embodiments 1-10.

The embodiments disclosed herein may include the use of a special purpose or general-purpose computer including various computer hardware or software modules, as discussed in greater detail below. A computer may include a processor and computer storage media carrying instructions that, when executed by the processor and/or caused to be executed by the processor, perform any one or more of the methods disclosed herein, or any part(s) of any method disclosed.

As indicated above, embodiments within the scope of the present invention also include computer storage media, which are physical media for carrying or having computer-executable instructions or data structures stored thereon. Such computer storage media may be any available physical media that may be accessed by a general purpose or special purpose computer.

By way of example, and not limitation, such computer storage media may comprise hardware storage such as solid state disk/device (SSD), RAM, ROM, EEPROM, CD-ROM, flash memory, phase-change memory ("PCM"), or other optical disk storage, magnetic disk storage or other magnetic storage devices, or any other hardware storage devices which may be used to store program code in the form of computer-executable instructions or data structures, which may be accessed and executed by a general-purpose or special-purpose computer system to implement the disclosed functionality of the invention. Combinations of the above should also be included within the scope of computer storage media. Such media are also examples of non-transitory storage media, and non-transitory storage media also embraces cloud-based storage systems and structures, although the scope of the invention is not limited to these examples of non-transitory storage media.

Computer-executable instructions comprise, for example, instructions and data which, when executed, cause a general purpose computer, special purpose computer, or special purpose processing device to perform a certain function or group of functions. As such, some embodiments of the invention may be downloadable to one or more systems or devices, for example, from a website, mesh topology, or other source. As well, the scope of the invention embraces any hardware system or device that comprises an instance of an application that comprises the disclosed executable instructions.

Although the subject matter has been described in language specific to structural features and/or methodological acts, it is to be understood that the subject matter defined in the appended claims is not necessarily limited to the specific features or acts described above. Rather, the specific features and acts disclosed herein are disclosed as example forms of implementing the claims.

As used herein, the term engine, module, component, agent, service, client, or the like may refer to software objects or routines that execute on the computing system. The different components, modules, engines, and services described herein may be implemented as objects or processes that execute on the computing system, for example, as separate threads. While the system and methods described herein may be implemented in software, implementations in hardware or a combination of software and hardware are also possible and contemplated. In the present disclosure, a 'computing entity' may be any computing system as previously defined herein, or any module or combination of modules running on a computing system.

In at least some instances, a hardware processor is provided that is operable to carry out executable instructions for performing a method or process, such as the methods and processes disclosed herein. The hardware processor may or may not comprise an element of other hardware, such as the computing devices and systems disclosed herein.

In terms of computing environments, embodiments of the invention may be performed in client-server environments, whether network or local environments, or in any other suitable environment. Suitable operating environments for at least some embodiments of the invention include cloud computing environments where one or more of a client, server, or other machine may reside and operate in a cloud environment.

Figure 4:
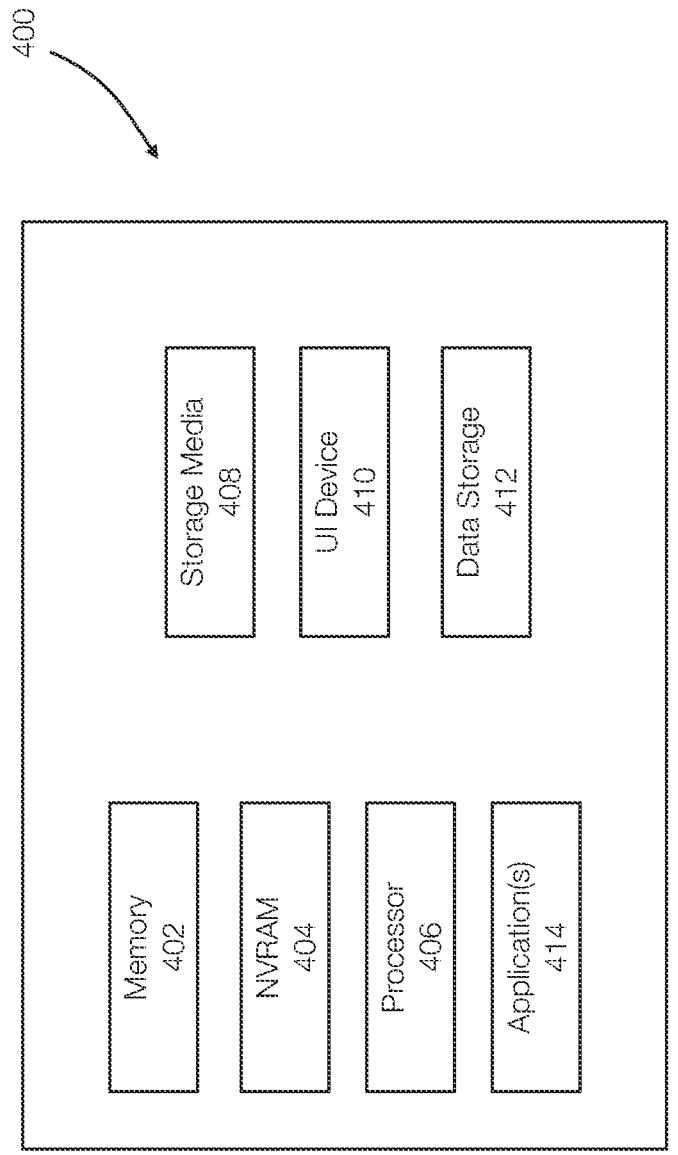
FIG. 4 discloses aspects of a computing device, system, or entity.

With reference briefly now to FIG. 4, any one or more of the entities disclosed, or implied, by the Figures and/or elsewhere herein, may take the form of, or include, or be implemented on, or hosted by, a physical computing device, one example of which is denoted at 400. As well, where any of the aforementioned elements comprise or consist of a virtual machine (VM), that VM may constitute a virtualization of any combination of the physical components disclosed in FIG. 4.

In the example of FIG. 4, the physical computing device 400 includes a memory 402 which may include one, some, or all, of random access memory (RAM), non-volatile memory (NVM) 404 such as NVRAM for example, read-only memory (ROM), and persistent memory, one or more hardware processors 406, non-transitory storage media 408, UI device 410, and data storage 412. One or more of the memory components 402 of the physical computing device 400 may take the form of solid state device (SSD) storage. As well, one or more applications 414 may be provided that comprise instructions executable by one or more hardware processors 406 to perform any of the operations, or portions thereof, disclosed herein.

The device 400 may represent an example of the orchestration engine or may represent a system or group of hardware configured to perform the functionality of the orchestration system or the orchestration engine.

Such executable instructions may take various forms including, for example, instructions executable to perform any method or portion thereof disclosed herein, and/or executable by/at any of a storage site, whether on-premises at an enterprise, or a cloud computing site, client, datacenter, data protection site including a cloud storage site, or backup server, to perform any of the functions disclosed herein. As well, such instructions may be executable to perform any of the other operations and methods, and any portions thereof, disclosed herein.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method comprising:
   receiving a problem from a client at an orchestration engine;
   dividing a variable associated with the problem into a number of pieces; and
   performing scaled encoding on each of the pieces to generate scaled encodings, wherein the scaled encodings comprise an interpolation between log encoding and unary encoding; and
   combining the encoded pieces into a final encoding.

2. The method of claim 1, wherein the problem comprises a quadratic unconstrained binary optimization model.

3. The method of claim 2, wherein the variable comprises an integer variable having a range.

4. The method of claim 2, wherein scaled encoding comprises performing log encoding on each of the pieces.

5. The method of claim 2, further comprising determining whether to perform the scaled encoding based on a cutoff value.

6. The method of claim 5, wherein the scaled log encoding ensures that coefficients in the scaled log encodings are less than the cutoff value.

7. The method of claim 6, wherein the number of pieces is based on a range of the variable.

8. The method of claim 5, wherein the cutoff value is based on weights of constraints and/or coefficients of the constraints.

9. The method of claim 1, wherein the problem comprises an Ising model or a HOBO model.

10. A non-transitory storage medium having stored therein instructions that are executable by one or more hardware processors to perform operations comprising:
    receiving a problem from a client at an orchestration engine;
    dividing a variable associated with the problem into a number of pieces; and
    performing scaled encoding on each of the pieces to generate scaled encodings, wherein the scaled encodings comprise an interpolation between log encoding and unary encoding; and
    combining the encoded pieces into a final encoding.

11. The non-transitory storage medium of claim 10, wherein the problem comprises an Ising model or a HOBO model.

12. The non-transitory storage medium of claim 10, wherein the problem comprises a quadratic unconstrained binary optimization model.

13. The non-transitory storage medium of claim 12, wherein the variable comprises an integer variable having a range.

14. The non-transitory storage medium of claim 12, wherein scaled encoding comprises performing log encoding on each of the pieces.

15. The non-transitory storage medium of claim 12, further comprising determining whether to perform the scaled encoding based on a cutoff value.

16. The non-transitory storage medium of claim 15, wherein the scaled log encoding ensures that coefficients in the scaled log encodings are less than the cutoff value.

17. The non-transitory storage medium of claim 16, wherein the number of pieces is based on a range of the variable.

18. The non-transitory storage medium of claim 15, wherein the cutoff value is based on weights of constraints and/or coefficients of the constraints.

19. A method for encoding an integer variable in a quadratic unconstrained binary optimization (QUBO) problem, the method comprising:
    receiving an integer variable having a predefined range;
    determining a coefficient cutoff value for the QUBO;
    decomposing the integer variable into a plurality of integer sub-variables, each sub-variable having a reduced range selected such that logarithmic encoding of the sub-variable produces coefficients that do not exceed the cutoff value;
    encoding each sub-variable using logarithmic binary encoding; and
    combining the encoded sub-variables to represent the integer variable in the QUBO, wherein the encoding of the integer variable uses more binary variables than a single logarithmic encoding of the integer variable and fewer binary variables than a unary encoding of the integer variable, wherein the encoding is an interpolation of logarithmic and unary encodings.

* * * * *